United States Patent [19]
Barbee et al.

[11] Patent Number: 5,456,788
[45] Date of Patent: Oct. 10, 1995

[54] METHOD AND APPARATUS FOR CONTACTLESS REAL-TIME IN-SITU MONITORING OF A CHEMICAL ETCHING PROCESS

[75] Inventors: Steven G. Barbee, Dover Plains; Madhav Datta, Yorktown Heights; Tony F. Heinz, Chappaqua; Leping Li, Poughkeepsie; Eugene H. Ratzlaff, Hopewell Junction; Ravindra V. Shenoy, Peekskill, all of N.Y.

[73] Assignee: International Business Machines Corporation, Armonk, N.Y.

[21] Appl. No.: 414,404

[22] Filed: Mar. 31, 1995

Related U.S. Application Data

[62] Division of Ser. No. 269,865, Jun. 30, 1994.

[51] Int. Cl.$^6$ .................................................... C23F 1/02
[52] U.S. Cl. ........................ 156/345; 156/627.1; 216/86
[58] Field of Search .................................. 156/626, 627, 156/345, 637, 639, 638, 642, 635

[56] References Cited

U.S. PATENT DOCUMENTS

| | | | |
|---|---|---|---|
| 2,933,675 | 4/1960 | Hoelzle | 324/30 |
| 3,163,568 | 2/1961 | Mieux | 156/627 |
| 3,553,052 | 1/1971 | Jubb, Jr. | 156/345 |
| 3,874,959 | 4/1975 | Hoekstra | 156/7 |
| 3,959,046 | 5/1976 | Bussmann et al. | 156/7 |
| 3,964,956 | 6/1976 | Snyder | 156/345 |
| 4,338,157 | 7/1982 | Kanda | 156/627 |
| 4,497,699 | 2/1985 | de Wit et al. | 204/129.2 |
| 4,621,037 | 11/1986 | Kanda et al. | 430/30 |
| 4,755,442 | 7/1988 | Hasebe et al. | 430/30 |
| 4,793,895 | 12/1988 | Kaanta et al. | 156/627 |
| 4,969,973 | 11/1990 | Rinck et al. | 156/627 |
| 4,995,939 | 2/1991 | Ferenczi et al. | 156/627 |
| 5,071,508 | 12/1991 | Scheithauer | 156/627 |
| 5,081,421 | 1/1992 | Miller et al. | 324/671 |
| 5,198,072 | 3/1993 | Gabriel | 156/627 |
| 5,338,390 | 8/1994 | Barbee et al. | 156/627 |

FOREIGN PATENT DOCUMENTS

| | | | |
|---|---|---|---|
| 55-46568 | 4/1980 | Japan | H01L 21/88 |
| 0052838 | 3/1984 | Japan | 156/627 |
| 59-113626 | 6/1984 | Japan | 156/627 |
| 273634 | 3/1990 | Japan | 156/627 |
| 4-96346 | 3/1992 | Japan . | |
| WO8100646 | 3/1981 | WIPO | 156/627 |

OTHER PUBLICATIONS

Goubau, W. M., "Capacitive Etch Rate Monitor for Dielectric Etching", IBM Technical Disc. Bulletin vol. 31, No. 1, Jun. 1988, 448–449.

Liu et al., "Resistance/Capacitance Methods for Determining Oxide Etch End Point", IBM Technical Disc. Bulletin vol. 16, No. 8, Jan. 1974, 2706–2707.

Hoekstra, J. P., "Establishing End Point During Delineation Process", IBM Technical Disc. Bulletin vol. 16, No. 6, Nov. 1973, 1717–1720.

Bassous et al., "An In–Situ Etch Rate Monitor Controller", IBM Technical Disc. Bulletin vol. 20, No. 3, Aug. 1977, 1232–1234.

Primary Examiner—R. Bruce Breneman
Assistant Examiner—Joni Y. Chang
Attorney, Agent, or Firm—Alison D. Mortinger

[57] ABSTRACT

A contactless method and apparatus for in-situ chemical etch monitoring of an etching process during etching of a workpiece with a wet chemical etchant are disclosed. The method comprises steps of providing a base member having a reference surface; releasably securing the workpiece to the base member; providing at least two sensors disposed on the base member to be proximate to but not in contact with the outer perimeter of the workpiece surface; and monitoring an electrical characteristic between said at least two sensors, wherein a prescribed change in the electrical characteristic is indicative of a prescribed condition of the etching process.

10 Claims, 3 Drawing Sheets

METHOD AND APPARATUS FOR CONTACTLESS REAL-TIME IN-SITU MONITORING OF A CHEMICAL ETCHING PROCESS

This application is a division of Ser. No. 08/269,865, Jun, 30, 1994, pending.

BACKGROUND OF THE INVENTION

1. Field of the Invention

This invention generally relates to a method and apparatus for monitoring the etching condition of a chemical etching process, and more particularly, to a contactless real-time in-situ method and apparatus for the same.

2. Discussion of the Related Art

Etching rates and etch end points must be carefully monitored and controlled in order to end etching processes at a desired time. In semiconductor processing, inadequate or excess etching time can result in undesirable film patterning. For instance, for semiconductor devices having film layers or features in the micron and sub-micron range, an inadequate etch or an excess etch would result in the insufficient removal or the excess removal of a desired layer. Insufficient removal of a desired layer can result in an undesired electrical open or electrical short when the desired layer to be removed is an insulator or a conductor, respectively. Additionally, if the etch is in excess, undercutting or punch through can occur resulting in poorly defined film patterning or total lift-off. Inadequate or excess etching further leads to undesirable reliability problems in the subsequently fabricated semiconductor device. As a semiconductor wafer is extremely expensive due to many processing steps involved in the making thereof, the need to critically control the etching end point in an etching process is highly desirable.

The processing of electronic materials by wet etching can involve immersion, spray, or submerged spray systems. The use of spray etching is particularly attractive since the impingement provided by the spray enhances mass transport at the workpiece surface, thereby increasing the etch rate. The controlled hydrodynamic conditions of the impingement also provide a high degree of uniformity over large surface areas. With through mask etching, the impingement affords an improvement in the anisotropy of the etching process. This has resulted in the use of spray chemical etching for a wide variety of applications in the electronics industry.

The high etch rates introduced by the impingement systems demand an accurate determination of the end point in order to end a given etching process at the desired time. Inadequate or excess etching can result in undercutting or badly defined patterning. Etch rates, etch times, and etch end points are difficult to consistently maintain or predict due to lot-to-lot differences in film thickness and composition, as well as etchant temperature, hydrodynamics and concentration variability.

It would thus be desirable to provide an etch monitor and end point detection system for chemical etching with impingement which is a real time, in-situ system. Such a system should not interfere with the impingement of the etchant on the workpiece being etched. In addition, such a system should be robust and versatile, providing reliable results despite changes in film characteristics and being independent of etch process fluctuations that normally occur during etch processing.

Until now, there have been no monitoring methods or apparatus for spray etch systems which satisfy the above mentioned requirements. The techniques that are most widely practiced to control etching processes are etch termination determined by visual end point observation and simple timing based on predicted etch rates and strictly controlled parameters which affect the etch rates. In the visual method, the end point is detected by monitoring the change in color of the surface being etched. This method is limited to certain samples that show a sharp change in color at the end point and can only be used for transparent etchants. Even under these conditions, the application of this method for submerged spray etching may be restricted by visual obstruction due to gas evolution. In addition, any observation area may be very restricted, if at all available. The results of end point determination from a limited area can be misleading when either the film or the etching process are significantly nonuniform. The visual method is further limited for spray methods due to an accumulation of etchant droplets on the sight window from spray backsplash and mist.

On the other hand, the simple timing method requires prior knowledge of the initial film thickness and etch rate. Etch rate is estimated at significant cost by etching monitor wafers with pre-etching and post-etching thickness measurements. The thickness measurements and etch time must be accurately determined and the etch conditions be precisely maintained to use the timing method. Etch conditions (e.g., temperature, reagent concentration) often cannot be kept constant, even at great expense. Implementation of a reliable, in-situ end point detection technique which provides a robust etching method that is independent of such variables is desirable.

As with the etch systems mentioned above, an etch end point must be accurately predicted and/or detected to terminate etching abruptly. Etch rates, etch times, and etch end points are difficult to consistently predict due to lot-to-lot variations in film thickness and constitution, as well as etchant temperature, flow, and concentration variability. That is, an etch rate is dependent upon a number of factors, which include, etchant concentration, etchant temperature, film thickness, and the film characteristics. Precise control of any of these factors can be very expensive to implement, for example, concentration control.

Some currently used etch rate end point determination techniques depend on indirect measurement and estimation techniques. Some etch monitoring techniques have relied on external measurements of film thickness followed by etch rate-estimation and an extrapolated etch end point prediction. However, etch rates may vary due to batch-to-batch differences in the chemical and physical characteristics of the film or the etchant. These extrapolation methods are inadequate.

As an alternative to indirect measurements and estimation techniques, real-time in-situ monitoring is preferred. Some in-situ techniques monitor the etch rate of a reference thin film. This may require additional preparation of a monitor wafer containing the reference thin film or a suitable reference may be unavailable. Still other techniques require physical contact of electrical leads with the wafer being etched and electrical isolation of those leads and associated areas of the wafer from the etchant. This presents problems associated with contamination, contact reliability and reproducibility, and the physical constraints which affect ease of use in manufacturing or automation.

It would thus be desirable to provide a method and apparatus which provides non-contact, real-time, in-situ monitoring of an etching condition of a wafer being etched.

SUMMARY OF THE INVENTION

An object of the present invention is to overcome the problems in the art discussed above.

Another object of the present invention is to provide a non-contact method of monitoring the etching condition of a wafer being etched, such a method being robust and versatile.

Yet another object of the present invention is to provide an accurate real-time, in-situ method and apparatus for monitoring an etching condition of a workpiece being etched.

Yet another object of the present invention is to provide method and apparatus for monitoring an etching condition of a workpiece being etched which does not interfere with the impingement of an etchant upon a workpiece.

According to the present invention, a contactless method for in-situ chemical etch monitoring of an etching process during etching of a workpiece with a wet chemical etchant, the workpiece characterized by a workpiece surface with side edge portions along an outer perimeter thereof, comprises the steps of: a) providing a base member having a reference surface; b) releasably securing the workpiece to said base member, wherein the workpiece surface is substantially flush with the reference surface; c) providing at least two sensors disposed on said base member to be proximate to but not in contact with the outer perimeter of the workpiece surface, said at least two sensors further being substantially flush with the reference surface and positioned on opposite side edge portions of the workpiece surface; and d) monitoring an electrical characteristic between said at least two sensors, wherein a prescribed change in the electrical characteristic is indicative of a prescribed condition of the etching process.

In addition, according to the present invention, a contactless in-situ chemical etch monitor for providing an indication of a prescribed condition of an etching process during etching of a workpiece with a wet chemical etchant, the workpiece characterized by a workpiece surface with side edge portions along an outer perimeter thereof, comprises the following. A base member having a reference surface is provided. A securing means is provided for releasably securing the workpiece to said base member, wherein the workpiece surface is substantially flush with the reference surface. At least two sensors are disposed on said base member to be proximate to but not in contact with the outer perimeter of the workpiece surface, said at least two sensors further being substantially flush with the reference surface and positioned on opposite side edge portions of the workpiece surface. Lastly, a monitoring means monitors an electrical characteristic between said at least two sensors, wherein a prescribed change in the electrical characteristic is indicative of the prescribed condition of the etching process.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings, in which.

CROSS-REFERENCE TO COPENDING APPLICATIONS

Copending U.S. patent application Ser. No. 07/985,413, filed Dec. 4, 1992, entitled "Contactless Real-Time In-Situ Monitoring of a Chemical Etching Process," assigned to the assignee of the present invention (attorney docket FI9-92-152), the disclosure of which is hereby incorporated by reference into the present application, describes a related method and apparatus for the contactless, real-time, in-situ monitoring of a chemical etching process during etching of a wafer in a wet chemical etchant bath, wherein two conductive electrodes are proximate to but not in contact with the at least one wafer, and further wherein the two electrodes are positioned on opposite front/back sides of the wafer. Six copending U.S. Patent Applications, filed on even date herewith, entitled variously: "Minimizing Overetch During A Chemical Etching Process", "Real Time Measurement Of Etch Rate During A Chemical Etching Process", "Measuring Film Etching Uniformity During A Chemical Etching Process", "Contactless Real-Time In-Situ Monitoring Of A Chemical Etching Process", "Method And Apparatus For Contactless Real-Time In-Situ Monitoring Of A Chemical Etching Process", "Fixture For In-Situ Noncontact Monitoring Of Wet Chemical Etching With Passive Wafer Restraint", assigned to the assignee of the present invention (attorney docket numbers FI9-93-035, FI9-93-036, FI9-93-037, FI9-93-038, FI9-94-053, FI9-94-054, respectively), describe improvements to the method and apparatus for contactless, real-time, in-situ monitoring of chemical etching disclosed in the 07/985,413 application. The disclosure of the six aforesaid copending applications is also hereby incorporated by reference into the present application.

DETAILED DESCRIPTION OF THE PREFERRED EMBODIMENTS

Figure 1:
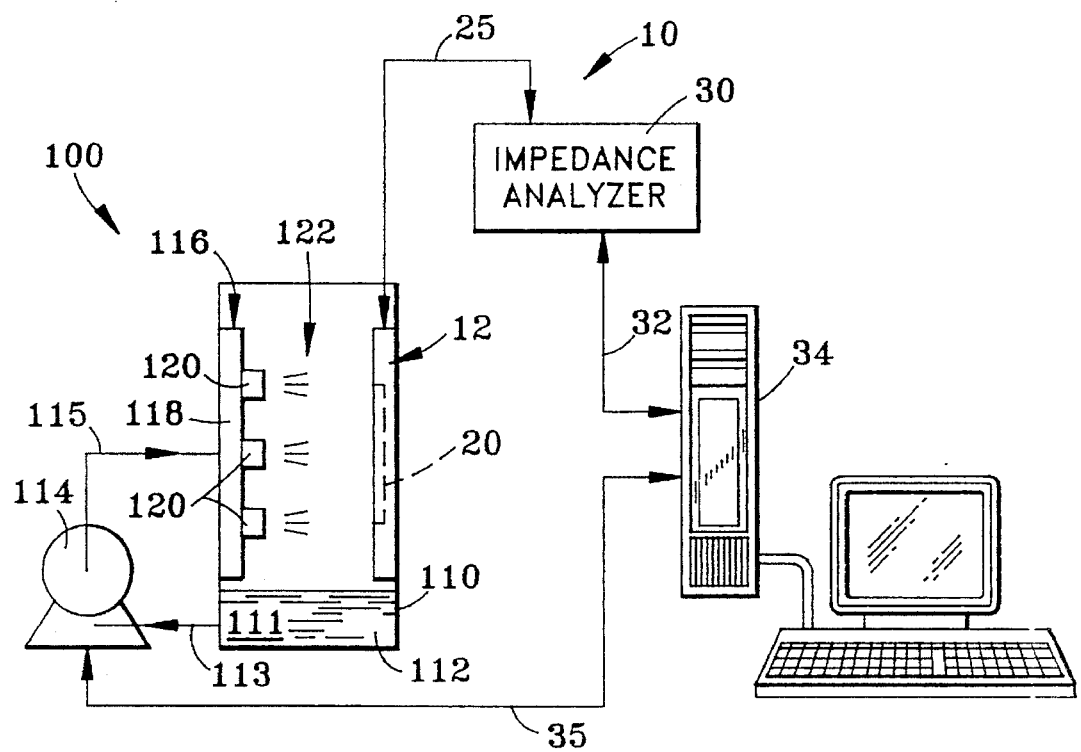
FIG. 1 shows an etch station incorporating a contactless real-time in-situ etching condition monitor according to the present invention.

Referring now to FIG. 1, there is shown an etch station 100 incorporating a contactless real-time, in-situ monitor 10 for providing an indication of a prescribed condition in an etching process according to the present invention. Etch station 100 can comprise an unsubmerged spray etch station including an etch chamber 110 having a reservoir 112 on a bottom portion thereof. Etch chamber 110 is of an appropriate size for a particular etching process. Reservoir 112 provides for storage of an appropriate etchant 111 therein during an etching process, as will be explained further herein below with respect to the operation of the present invention. Unsubmerged spray etch stations are well known in the art and thus only those parts thereof corresponding to or cooperating directly with the present invention shall be discussed herein. Etch station 100 can likewise comprise a submerged spray etch station or an immersion etch station, as are well known in the art.

An etchant pump 114 is suitably connected to the reservoir 112 by return line 113. Pump 114 is also suitably connected to an etchant spray head 116 by supply line 115. Etchant spray head 116 comprises a head member 118 with one or more spray nozzles 120 thereon. Etchant received by spray head 116, through supply line 115 to head member 118, is propelled or expelled, in part, as a function of the construction of spray nozzles 120 and further in accordance to the operation of pump 114, as shown by spray lines indicated by numeral 122 in FIG. 1.

Figure 2:
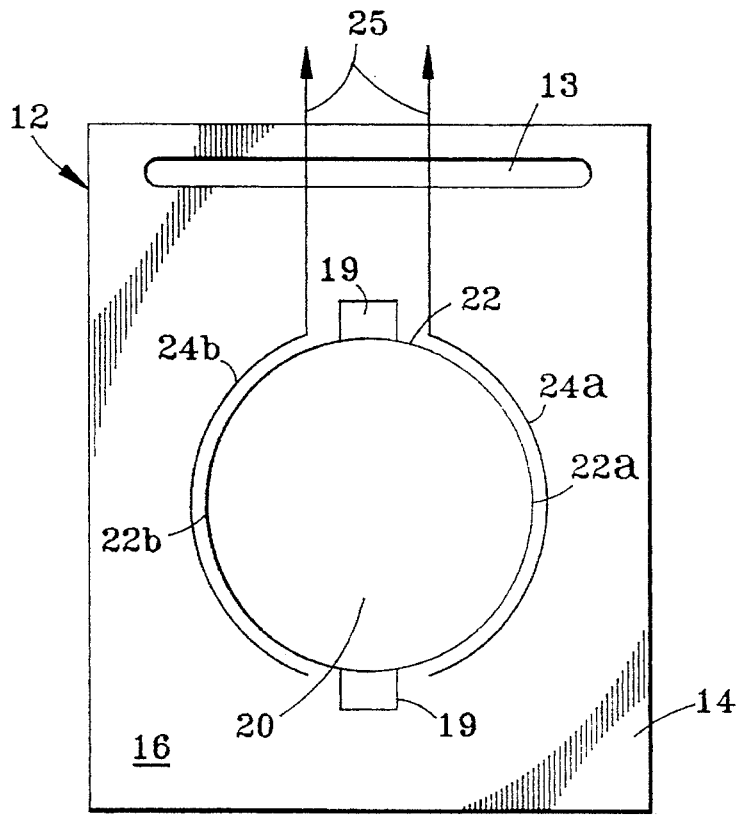
FIG. 2 shows a frontal view of a portion of a contactless real-time in-situ etching condition monitor according to the present invention in further detail.
Figure 3:
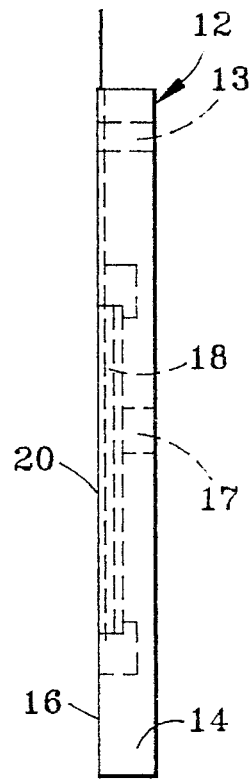
FIG. 3 shows a side view of the portion of a contactless real-time in-situ etching condition monitor shown in FIG. 2.

Referring now to FIGS. 1 and 2, monitor 10 comprises an etch characteristic fixture 12. Etch characteristic fixture 12 comprises a base member 14 of a suitable nonconductive material, such as polyvinyl chloride (PVC) or teflon, having a reference surface 16 thereon. Reference surface 16 is substantially planar. Fixture 12 further comprises a recess 18 formed in base member 14 and the reference surface 16. Recess 18 is suitably dimensioned in cross-section for receiving a workpiece 20 therein. Recess 18 is further suitably dimensioned in depth such that upon receipt of workpiece 20 therein, a surface of the workpiece 20 is substantially flush with the reference surface 16. Base member 14 further includes a vacuum port 17 positioned from a rear side thereof and extending through to recess 18. Upon insertion of workpiece 20 into recess 18 outside of the etchant environment, as will be further explained herein below with respect to the operation of the invention, a vacuum is applied from a vacuum source (not shown) for releasably securing workpiece 20 in recess 18.

Workpiece 20 can comprise, for example, a semiconductor wafer or substrate having a nominal thickness on the order of 600 nm. Workpiece 20 further comprises one or more film layers on a surface thereof, the film layers being either patterned or unpatterned. Furthermore, one or more of the film layers on workpiece 20 are desired to be removed by the chemical etchant 111. The chemical etchant further characterized by side edge portions $22_a$ and $22_b$ 111 thus comprises a suitable etchant for removing the desired film layer or layers. Workpiece 20 can be still along an outer perimeter 22 thereof.

Base member 14 further includes appropriate handling recesses 19 for enabling manual and/or automated handling of workpiece 20 at a perimeter position or portions thereof. Recesses 19 are constructed such that they do not affect or interfere with the ability of workpiece 20 to be releasably secured in recess 18. Likewise, base member 14 may include alternate means for enabling the insertion and removal of workpiece 20 into and out of recess 18, respectively. Still further, base member 14 may include an attachment aperture 13, for enabling suitable manual and/or automated handling of fixture 12 into and out of chamber 110 of etch station 100. For instance, a robotic arm with a suitable gripper (not shown) may grasp fixture 12 at attachment aperture 13.

Monitor 10 further comprises at least two sensors $24_a$ and $24_b$, disposed. On base member 14 of etch characteristic fixture 12. More particularly, the at least two sensors $24_a$ and $24_b$ are disposed on base member 14 in a prescribed arrangement to be proximate to the perimeter of recess 18, and further, to be proximate to but not in contact with the outer perimeter of the workpiece surface. This latter condition is fulfilled when a workpiece is releasably secured in recess 18 of base member 14. Prescribed spacing of sensors $24_a$ and 24b at a minimum spacing from the such that sensors $24_a$ and 24b are proximate to but not in perimeter of workpiece 20 is on the order of 1.0 mm. The prescribed spacing of sensors 24a and 24b is established direct contact with workpiece 20, thus eliminating any need for special physical contacting electrodes, while permitting suitable etchant access and flow. The proximate and non-contact sensors $24_a$ and 24b further preclude any physical damage and/or contaminations to workpiece 20 16 and positioned on opposite edge portions $22_a$ and $22_b$ of during an etching process. Furthermore, the at least two sensors are substantially flush with the reference surface the workpiece surface, advantageously enabling flow of an etchant to be substantially hydrodynamically unperturbed.

In a preferred embodiment, the at least two sensors $24_a$ and 24b comprise a pair of chemically inert electrically conductive wires imbedded in the reference surface 16 of base member 14. The at least two sensors $24_a$ and 24b further comprise two sensors. The inert conductive wires are insensitive to the etchant 111 and non-contaminating to the workpiece. The inert conductive wires further comprise respective exposed surfaces thereof, the exposed surfaces being in substantially the same plane as that of the workpiece surface. Sensors $24_a$ and $24_b$ may comprise platinum wires, for example.

Referring now back to FIG. 1, the at least two sensors $24_a$ and 24b are suitably connected to an electrical characteristic monitoring means 30 via signal lines 25. Monitoring means 30 can comprise any suitable commercially available impedance analyzer. Monitoring means 30 is connected via signal lines 32 to control means 34. Control means 34 comprises a computer or programmable controller for providing feedback control to initiate, control, and terminate an etching operation. For instance, control means 34 is connected to pump 114 via signal line 35 for suitably controlling the operation of pump 114 to flow etchant 111 to spray head 116 or not to flow the etchant. Impedance analyzers, computers, and programmable controllers are well known in the art.

In operation, the present invention provides a realtime method and apparatus for monitoring a prescribed etching characteristic, such as, etch rate or etch end point of an etching process. Etch end point is used herein to refer to the point in time when a desired film layer or portion thereof is completely removed. Monitoring of the prescribed etching characteristic is effected by electrically sensing, in-situ, changes in an electrical between the two sensors $24_a$ and $24_b$. characteristic, such as, the impedance or an element or elements of impedance (e.g., reactance and/or resistance), During the removal of a conducting or dielectric film from the etched workpiece or wafer 20, the impedance of the etched wafer 20 and its environment changes. The changes of impedance with time are related to etching rates. Changes in the rate of change in the impedance element(s), specifically slope reversals and trend discontinuities, are related to changes in phase transitions where a change in the etchant-wafer interface has occurred. These impedance transitions mark distinct etching characteristics, such as, etch end points. Thus etching rates and etching end points can be readily determined in real-time.

The contactless real-time, in-situ chemical etching method and apparatus of the present invention operate by first placing the workpiece or wafer 20 to be etched into etch characteristic fixture 12. That is, workpiece 20 may be gripped at two opposite positions on its perimeter, corresponding to handling recesses 19 of FIG. 2. Thereafter workpiece 20 is placed into recess 18 and vacuum is applied by the vacuum supply means (not shown). Workpiece 20 is thereby releasably secured to etch characteristic fixture 12. Fixture 12 is then suitably positioned within etch chamber 110 of etch station 100. An etchant 111 is provided by a suitable etchant supply (not shown) into reservoir 112. Control means 34 provides an appropriate signal to pump 114 for initiating the pumping of etchant 111 from reservoir 112 and through return line 113. Etchant 111 is thereafter pumped through supply line 115 to spray head 116. Etchant 111 is thereby sprayed upon workpiece 20. During such spraying of etchant upon workpiece 20, a thin sheet of liquid forms across the exposed faces of the workpiece 20, sensors $24_a$ and $24_b$, and fixture 12, thereby creating an unbroken thin liquid film contiguous to the workpiece surface and the sensors. The etch process is monitored by measuring the impedance between the sensors. The impedance characteristic of the film layer being etched and its environment is measured in a standard way for measuring impedance, such as by applying DC, AC, or pulsed current or voltage to the sensors and monitoring the passed current or developed potential. Electrical characteristic monitoring means 30 provides a means for monitoring the passed current or developed potential in an appropriate way. As previously discussed, electrical characteristic monitoring means 30 can comprise, for example, any commercially available impedance analyzer for measuring an impedance between the sensors during etching.

Described in another way, the present invention provides for the in-situ monitoring of dimensional changes of the wafer in the liquid etchant. Dimensional changes, the etchant environment. The two sensors $24_a$ and $24_b$ are such as film thinning, are monitored by sensing resultant changes in the electrical characteristics of the wafer and adjacent or proximate to but not in direct physical contact with the workpiece 20. The two sensors are also substantially flush with the surface of the workpiece 20 being etched. Such an arrangement of the sensors to the workpiece advantageously provides very high detection sensitivity while retaining other advantages associated with contactless techniques. In addition, the sensors do sensors $24_a$ and $24_b$ and workpiece 20 are in ohmic or not perturb a) the flow of the etchant to the workpiece, nor b) flow of the etchant away from the sample. The two capacitive contact with the etchant solution 111. Electrical characteristic monitoring means 30 provides a means of monitoring changes in impedance or changes in an appropriate element of the impedance between the sensors.

EXAMPLE

Operation of the present invention will now be further described using two examples. The present invention has been applied to the monitoring of the etching of 200 nm copper (Cu) films and 40nm chromium (Cr) films. The effectiveness of the detection capability of the present invention has been demonstrated for three different chemical etching configurations: i) unsubmerged spray etching (forced convection); ii) submerged spray etching (forced convection); and iii) immersion etching (natural convection).

Figure 4C:
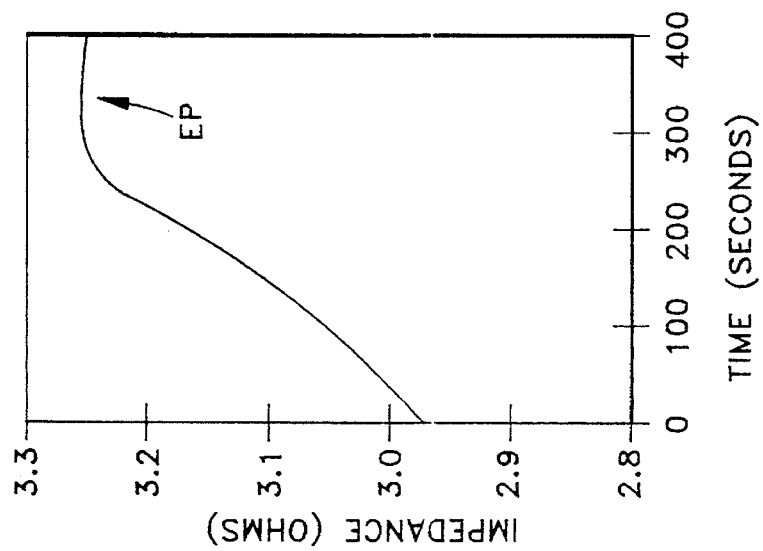
FIGS. 4a–c show graphs of monitored electrical characteristics of etching of a first type of film on a substrate using the method and apparatus according to the present invention; and, FIGS. 5a–c show graphs of monitored electrical characteristics of a second type of film on a substrate using the method and apparatus according to the present invention.
Figure 4B:
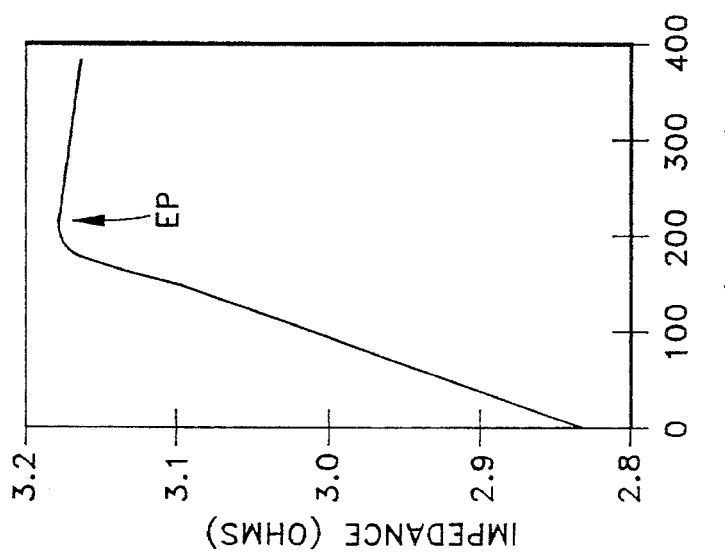
Figure 4A:
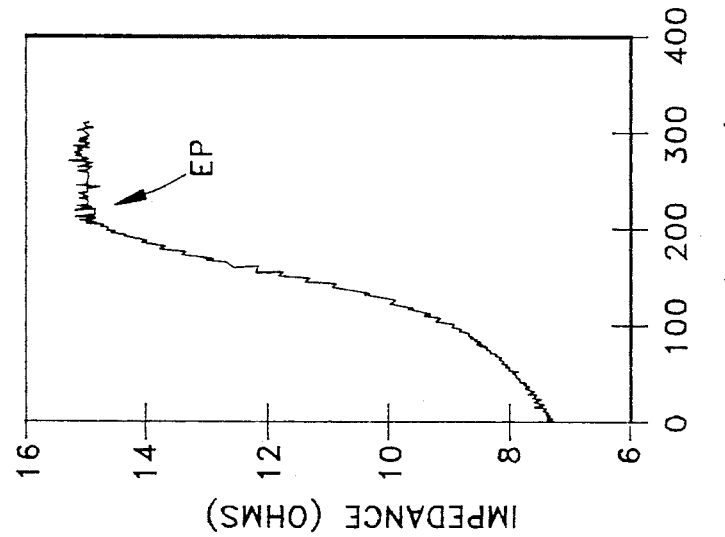

With respect to the etching of the Cr films, 40 nm Cr films on top of blanket silicon (Si) wafers were etched in alkaline permanganate etchant consisting of 0.25M $KMnO_4$ and 0.5M KOH. Cr etching in alkaline permanganate was chosen to illustrate the utility of the present invention as alkaline permanganate is extensively used in etching of Cr adhesion layers as well as for making Cr photomasks. Since the etchant is opaque, visual end point detection methods are not feasible. FIG. 4 shows the impedance spectra of the etching process for the various chemical etching configurations indicated above (i.e., FIGS. 4a, 4b, and 4c correspond to a) spray, b) submerged spray, and c) immersion etching, respectively). The inflection point "EP" in each of the spectra indicates the etching end point, which correspond to the complete removal of the Cr film. The impedance spectra show that the etch rate is increased by the impingement. The etch rates calculated based on the nominal Cr film thickness of 400 Angstroms are 75 Angstroms/minute for immersion etching, 100 Angstroms/minute for submerged spray etching, and 107 Angstroms/minute for unsubmerged spray etching.

Figure 5C:
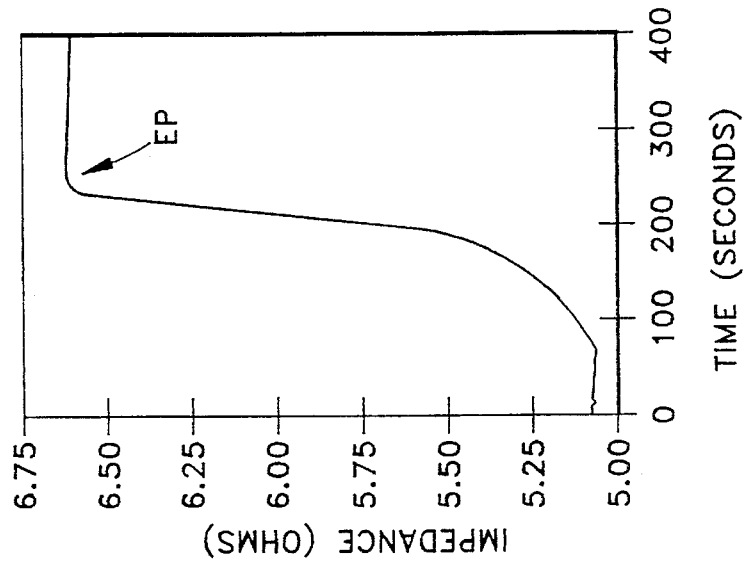
Figure 5B:
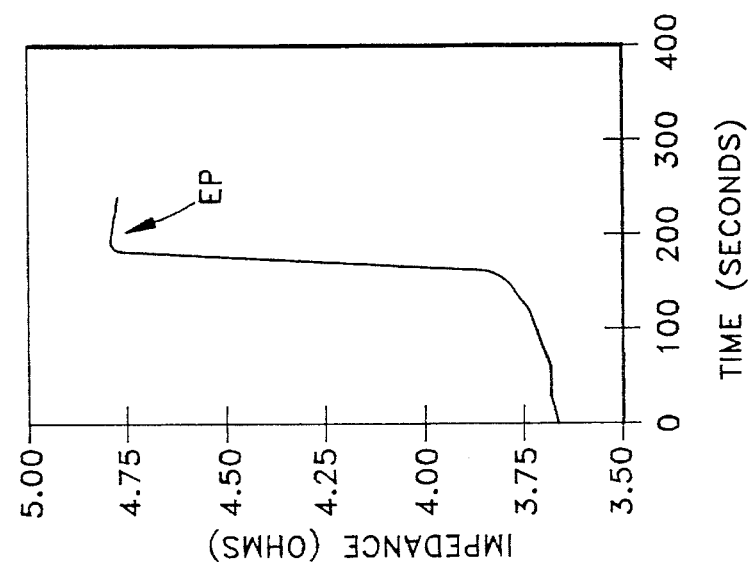
Figure 5A:
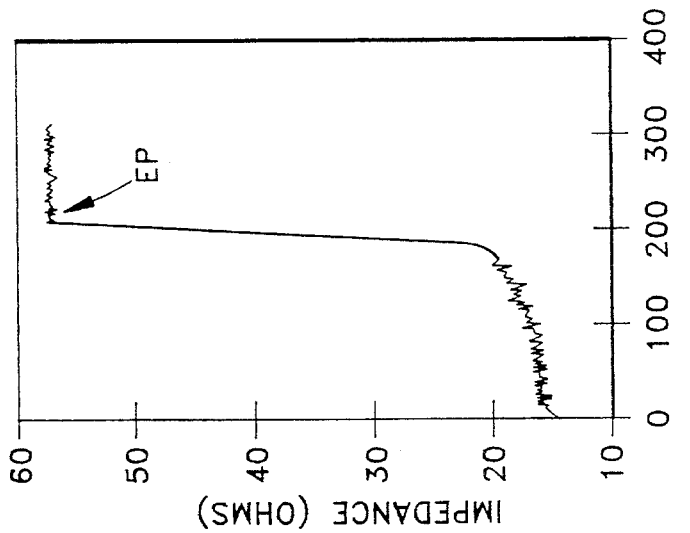

With respect to the etching of the Cu films, 200 nm Cu films on top of blanket Si wafers were etched with Ammonium Persulfate solution consisting of 12.5 grams/liter of $(NH_4)_2S_2O_8$, 5 cc/liter of $H_2SO_4$ and 1 gram/liter of $CuSO_4$. FIG. 5 shows the impedance spectra of the etching process for the various chemical etching configurations indicated above (i.e., FIGS. 5a, 5b, and 5c correspond to a) spray, b) submerged spray, and c) immersion etching, respectively). The inflection point "EP" in each of the spectra indicates the etching end point, which correspond to the complete removal of the Cu film. An increase in the etch rate of Cu due to the impingement can be seen. The etch rates calculated based on the nominal Cu film thickness of 2000 Angstroms are 7.7 Angstroms/second for immersion etching, 10.2 Angstroms/second for submerged spray etching, and 9.4 Angstroms/second for unsubmerged spray etching.

As can be seen from the above examples, the method of the present invention provides a reliable end point detection with good signal to noise (S/N) ratio. Other material combinations such as semiconductor or insulator on conductor or conductor on insulator should work equally well with the present invention. A discernible change in the impedance spectrum was also observed for spray etching of a 200 nm Cu film on top of Cr(40 nm)/Si.

The present invention thus provides sufficient information to accurately identify an etch end point, that is, where the etchant had removed a desired layer.

Referring again to FIG. 1, present invention further contemplates etch station 100 incorporating the contactless real-time in-situ monitor 10. Control means 34 is responsive to electrical characteristic monitoring means 30. Control means 34 can comprise, for example, a computer or programmable controller as discussed above, in conjunction with any suitable mechanism (not shown) for raising and lowering the etch characteristic fixture into and out of the etch chamber 110. Means 34 controls the placement of fixture 12 into and out of the etch chamber 110, in addition to controlling the flow of etchant 111 via pump 114, in response to the sensing of a prescribed etching condition or conditions by the electrical characteristic monitoring means 30. Thus, etch station 100 provides accurate and highly efficient etching control.

Thus there has been shown a real-time in-situ monitoring method and apparatus which provide accurate, non-contact, monitoring of an etching characteristic of an etching process. Such a method and apparatus are inexpensive to implement and ensure the integrity of the etched wafer or wafers. Etching of a wafer can be controlled precisely.

While the invention has been particularly shown and described with reference to the preferred embodiment thereof, it will be understood by those skilled in the art that various changes in form and detail may be made therein without departing from the spirit and scope of the invention. For example, system condition parameters, such as impedance analyzer frequency, etc., may need to be adjusted accordingly to obtain optimum detection sensitivity.

What is claimed is:

1. A contactless in-situ chemical etch monitor for providing an indication of a prescribed condition of an etching process during etching of a workpiece with a wet chemical etchant, the workpiece characterized by a workpiece surface with side edge portions along an outer perimeter thereof, said monitor comprising:

a) a base member having a reference surface;
b) means for releasably securing the workpiece to said base member, wherein the workpiece surface is substantially flush with the reference surface;
c) at least two sensors disposed on said base member to be proximate to but not in contact with the outer perimeter of the workpiece surface, said at least two sensors further being substantially flush with the reference surface and positioned on opposite side edge portions of the workpiece surface; and
d) means for monitoring an electrical characteristic between said at least two sensors, wherein a prescribed change in the electrical characteristic is indicative of the prescribed condition of the etching process.

2. The monitor of claim 1, wherein:

said base member further includes a recess formed in the reference surface thereof, the recess being of a prescribed dimension for receiving the workpiece therein; and said means for releasably securing the workpiece to said base member comprises a prescribed vacuum source, the vacuum source for releasably securing the workpiece in the recess.

3. The monitor of claim 1, wherein the at least two sensors comprise chemically inert conductive wires imbedded in the reference surface of said base member, the inert wires having respective exposed surfaces thereof, the exposed surfaces being in substantially the same plane as that of the workpiece surface.

4. The monitor of claim 1, wherein the at least two sensors comprise two sensors.

5. The monitor of claim 1, wherein the monitoring means comprises an impedance monitor and further wherein the prescribed change comprises a prescribed change in impedance.

6. An etch station having contactless in-situ control of an etching process during etching of a workpiece with a wet chemical etchant, the workpiece characterized by a workpiece surface with side edge portions along an outer perimeter thereof, said etch station comprising:

a) a base member having a reference surface;
b) means for releasably securing the workpiece to said base member, wherein the workpiece surface is substantially flush with the reference surface;
c) at least two sensors disposed on said base member to be proximate to but not in contact with the outer perimeter of the workpiece surface, said at least two sensors further being substantially flush with the reference surface and positioned on opposite side edge portions of the workpiece surface;
d) means for monitoring an electrical characteristic between said at least two sensors, wherein a prescribed change in the electrical characteristic is indicative of a prescribed condition of the etching process; and
e) means for controlling the etching process in response to the monitoring of the prescribed change in the electrical characteristic.

7. The etch station of claim 6, wherein:

said base member further includes a recess formed in the reference surface thereof, the recess being of a prescribed dimension for receiving the workpiece therein; and said means for releasably securing the workpiece to said base member comprises a prescribed vacuum source, the vacuum source for releasably securing the workpiece in the recess.

8. The etch station of claim 6, wherein the at least two sensors comprise chemically inert conductive wires imbedded in the reference surface of said base member, the inert wires having respective exposed surfaces thereof, the exposed surfaces being in substantially the same plane as that of the workpiece surface.

9. The etch station of claim 6, wherein the at least two sensors comprise two sensors.

10. The etch station of claim 6, wherein the monitoring means comprises an impedance monitor and further wherein the prescribed change comprises a prescribed change in impedance.

* * * * *